United States Patent [19]

Aton

[11] Patent Number: 5,122,739
[45] Date of Patent: Jun. 16, 1992

[54] STM-LIKE DEVICE AND METHOD FOR MEASURING NODE VOLTAGES ON INTEGRATED CIRCUITS

[75] Inventor: Tomas J. Aton, Dallas, Tex.

[73] Assignee: Texas Instruments Incorporated, Dallas, Tex.

[21] Appl. No.: 609,987

[22] Filed: Nov. 6, 1990

[51] Int. Cl.⁵ ............................................. C01R 33/30
[52] U.S. Cl. .......................... 324/158 R; 324/158 D; 250/306
[58] Field of Search .................. 324/71.3, 73.1, 158 R, 324/158 D; 250/306, 307, 310, 311, 423 F; 356/398, 445

[56] References Cited

U.S. PATENT DOCUMENTS

| 4,724,318 | 2/1988 | Binnig | 250/306 |
| 4,918,309 | 4/1990 | Beha et al. | 250/306 |
| 4,924,091 | 5/1990 | Hansma et al. | 250/306 |
| 4,941,753 | 7/1990 | Wickramasinghe | 324/158 D |
| 4,992,659 | 2/1991 | Abraham et al. | 250/307 |

OTHER PUBLICATIONS

Pelz et al., Extremely Low-Noise Potentiometry with a Scanning Tunneling Microscope, Mar. 1989, 301–305.
Anders et al., Potentiometry for thin-film structures using atomic force microscopy, Jan./Feb. 1990, 394–399.
Muralt et al., Wide-range low operating voltage, bimorph STM: Application as Potentiometer, Sep. 1986, 443–450.

*Primary Examiner*—Vinh Nguyen
*Attorney, Agent, or Firm*—Stanton C. Braden; Richard L. Donaldson; William E. Hiller

[57] ABSTRACT

A method and apparatus for measuring node voltage on an integrated circuit is diclosed herein. A sensing needle 10, which is connected to supply voltage 20, is positioned directly above node 12 on integrated circuit 14. Tunneling or field emission current 30 is produced in sensing needle 10 due to the difference in potential between sensing needle 10 and node 12. Supply voltage 20 is adjusted to set current 30 to an initial value. When the voltage on node 12 changes, the current 30 will also try to change. When a change in current 30 is detected, a signal 28 is generated to adjust supply voltage 20 such that current 30 returns to its initial value. Consequently, the change in supply voltage 20 mirrors the change in voltage on node 12.

33 Claims, 3 Drawing Sheets

STM-LIKE DEVICE AND METHOD FOR MEASURING NODE VOLTAGES ON INTEGRATED CIRCUITS

BACKGROUND OF THE INVENTION

1. Field of the Invention

This invention relates in general to the evaluation of integrated circuits, and is specifically related to the method and apparatus for measuring node voltage on an integrated circuit.

2. Description of the Related Art

As the demand for and complexity of integrated circuits increases, it becomes necessary to find more efficient and less expensive ways to evaluate integrated circuits. Measuring internal node voltages is an integral part of evaluating integrated circuits. One conventional method of measuring node voltages is with the use of needle probles. Needle probes are low capacitance probes which are set down on the integrated circuit such that each needle probe physically contacts a node of integrated circuit which is to be measured. However, because the needle probes need to actually contact a node to measure its voltage, the metal line which forms the node may become damaged by contact with the probe. Furthermore, the probe itself will load the node and result in a distorted reading.

Another conventional method of measuring internal node voltages is Electron Beam Testing. Accurate Electron Beam Testers require an electron beam which is usually produced by a Scanning Electron Microscope (SEM) in a vacuum. In operation, the electron beam is focused onto a node of the integrated circuit thereby creating low energy secondary electrons. The energy of the secondary electrons is modulated by the surface potential of the sample. A positive voltage on the node attracts the secondary electrons. Consequently, the electrons slow down. A negative voltage on the node repels the electrons and consequently, the electrons speed up. Usually a specialized secondary electron detector is require to measure the average energy of the secondary electrons. Low average energy indicates slow moving electrons and a positive voltage on the node. On the other hand, a high average energy indicates fast moving electrons and a negative voltage. Accordingly, the relative voltage of the node can be determined by the level of average energy.

There are, however, several undesirable limitations associated with Electron Beam Testing. First, measurements must be taken in a vacuum as air molecules impede the measurement. Second, an Electron Beam Tester requires a significant amount of hardware, especially that required to maintain a vacuum. Accordingly, an Electron Beam Tester is expensive. Finally, Electron Beam Testing is only sensitive to approximately 10-30 mv. Sensitivity to millivolts or even microvolts is desirable.

OBJECTS OF THE INVENTION

It is therefore an object of this invention to provide a method and apparatus which can measure node voltage in air.

It is further an object of this invention to provide such a method and apparatus which is sensitive to at least 1 mv.

It is still further an object of this invention to provide such a method and apparatus which does not damage the integrated circuit.

It is still further an object of this invention to provide such a method and apparatus which also inexpensive.

These and other objects of the invention, together with the features and advantages thereof, will become apparent from the detailed specification when read together with the accompanying drawings in which applicable reference numerals have been carried forward.

SUMMARY OF THE INVENTION

The foregoing objects of the invention are accomplished by a method for measuring node voltage on an integrated circuit. A conductive needle is positioned a fixed distance above a node on the integrated circuit. A voltage is supplied to the sensing needle at a predetermined voltage level. The voltage is then adjusted to produce a current between the conductive needle and the node at a predetermined current level. The current is maintained at the predetermined current level by adjusting the voltage supplied to the conductive needle.

DETAILED DESCRIPTION OF THE PREFERRED EMBODIMENT OF THE INVENTION

Figure 1:
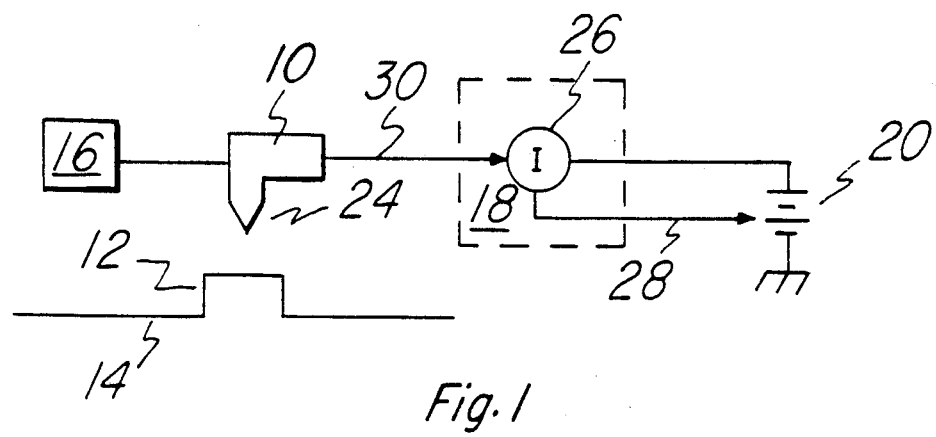
FIG. 1 is a schematic diagram of an apparatus for measuring node voltage according to the invention.

Referring to FIG. 1, a sensing needle 10 is positioned above node 12 of an integrated circuit 14 so that the voltage on node 12 may be measured. The distance between sensing needle 10 and node 12 is fixed to allow tunneling current, or alternatively field emission current, (i.e. current 30) to flow between node 12 and sensing needle 10. Current 30 is a function of the potential difference and distance between sensing needle 10 and node 12. Voltage control circuit 18 is connected between sensing needle 10 and supply voltage 20 to detect a change in current 30. Responsive to a detected change in current 30, voltage control circuit 18 also generates feedback signal 28 to adjust supply voltage 20 so that current 30 returns to its initial value. When current 30 has returned to its initial value, the change in supply voltage 20 equals the change in voltage level on node 12. Accordingly, the change in voltage level on node 12 is determined by recording the change in voltage level of supply voltage 20.

Integrated circuit 14 is a device under test which may be evaluated in either wafer or packaged form. To evaluate integrated circuit 14, external connections (not shown) are made to integrated circuit 14 as required for operation. The number and type of external connection required will depend on the individual integrated circuit under test. External connection methods, such as wire bonding, will be obvious to those skilled in the art. Typically, integrated circuit 14 contains a variety of nodes 12 from which voltage can be measured during operation. Nodes 12 generally consist of metal or semiconductor material. For example, node 12 may consist of an interconnect line or a source or drain region of a transistor. Other examples of node 12 will be obvious to those skilled in the art.

Sensing needle 10 is similar to those used in traditional Scanning Tunneling Microscope (STM) technology. Typically, sensing needle 10 consists of conductive material such as tungsten and has a sharp cone-shaped tip 24 on the lower end which is placed over node 12 to generate tunneling current. Alternatives, such as attracting field emission current, will be obvious to those skilled in the art and are considered within the scope of the present invention. Tip 24 is typically no more than 3 or 4 atoms wide and can be as narrow as one atom wide. Consequently, no limitations are placed on the width of node 12 by the present invention, and accordingly, the width of node 12 may be determined by device fabrication limits.

Voltage control circuit 18 generally consists of current detector 26 and feedback signal 28. Current detector 26 is connected between sensing needle 10 and supply voltage 20 to detect a change in current 30. Feedback signal 28 is connected to supply voltage 20 in order to adjust supply voltage 20 responsive to a change in current 30. The accuracy to which the present invention can measure voltage depends on the degree of sensitivity of current detector 26. Sensitivity to 1 microvolt is possible. Circuitry for sensing the current changes, such as current detector 26, are well known and will be obvious to those skilled in the art.

Supply voltage 20 is an adjustable voltage supply which supplies voltage to sensing needle 10. Supply voltage 20 is connected to sensing needle 10 via voltage control circuit 18. The voltage level of supply voltage 20 is adjusted according to feedback signal 28 to mirror changes in the voltage level of node 12.

Figure 2A:
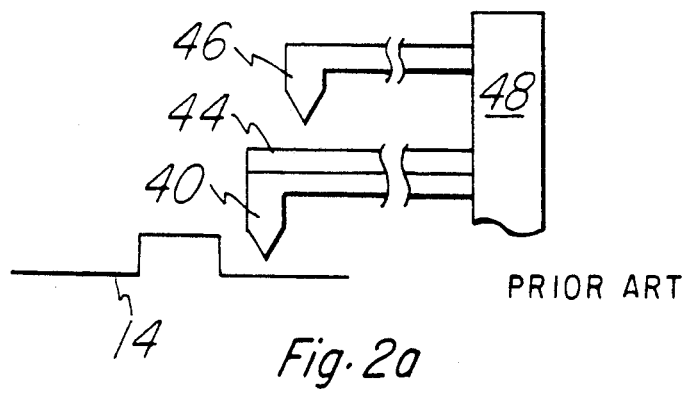
FIGS. 2a–e are schematic diagrams of a prior art apparatus for fixing the distance between a sensing needle and an integrated circuit during various stages of operation.
Figure 2B:
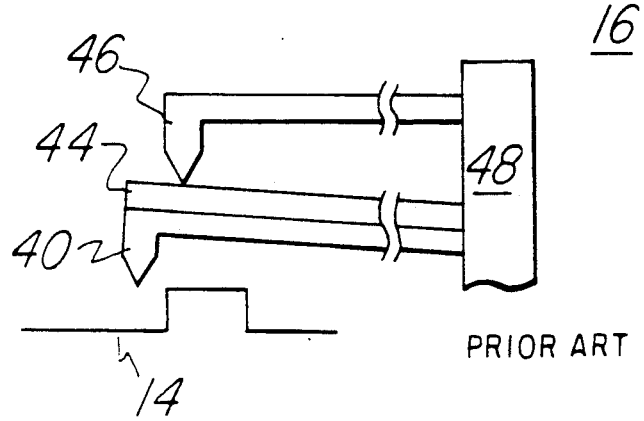
Figure 2C:
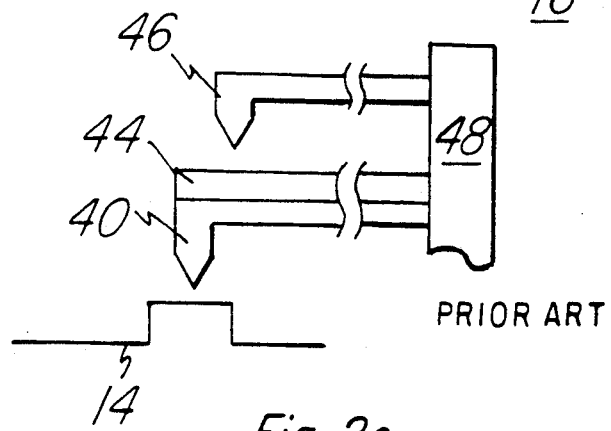
Figure 2D:
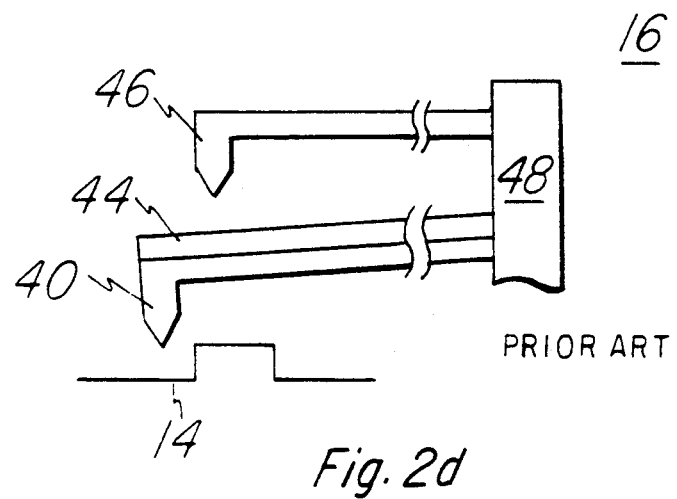
Figure 2E:
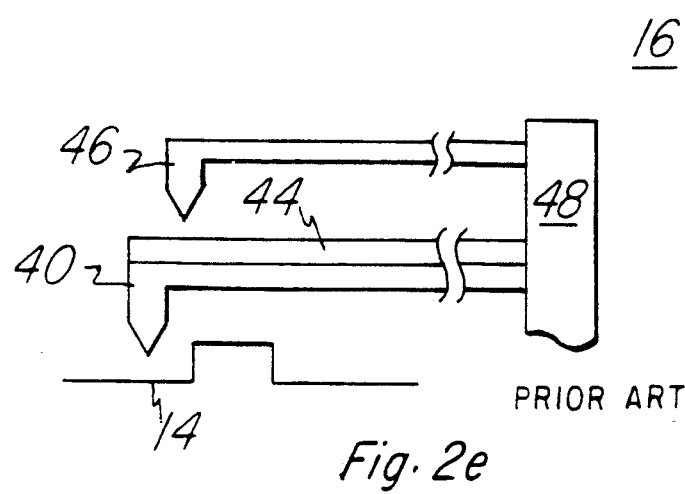

In operation, sensing needle 10 is positioned approximately one nanometer above node 12 of integrated circuit 14. Because sensing needle 10 never contacts node 12, integrated circuit 14 is not damaged by the measurement, unlike some prior art techniques. One method of positioning sensing needle 12 uses traditional Atomic Force Microscope (AFM) technology. Referring to FIG. 2a, positioner 16 consists of lower arm 40, metal layer 44 which covers lower arm 40, upper arm 46 located above metal layer 44, and piezoelectric z-drive 48 which is connected to both lower arm 40 and upper arm 46. Lower arm 40 is positioned over integrated circuit 14. As the surface of integrated circuit 14 rises, lower arm 40 is repelled, as shown in FIG. 2b. As a result metal layer 44 moves closer to upper arm 46 and the tunneling current 50 between upper arm 46 and metal layer 44 increases. Responsive to the increased current, piezoelectric z-drive raises both upper arm 46 and lower arm 40 until current 50 returns to its initial value, as shown in FIG. 2c. Conversely, as the surface of integrated circuit 14 falls, lower arm 40 also falls, as shown in FIG. 2d. As a result metal layer 44 moves farther away from upper arm 46 and the tunneling current 50 between upper arm 46 and metal layer 44 decreases. Responsive to the decreased current, piezoelectric z-drive lowers both upper arm 46 and lower arm 40 until current 50 returns to its initial value, as shown in FIG. 2e. As a result, sensing needle 10 maintains a fixed distance above integrated circuit 14. Other alternatives for positioning sensing needle 10 will be obvious to those skilled in the art and are considered within the scope of the present invention.

With sensing needle 10 positioned above node 12, supply voltage 20 is set to an initial voltage level. (Of course, supply voltage 20 may alternatively be set prior to positioning sensing needle 10.) Generally, supply voltage 20 is set such that the potential difference between sensing needle 10 and node 12 is small. The potential difference between sensing needle 10 and node 12 will cause electrons to tunnel across the gap and produce tunneling current, current 30, in sensing needle 10. One advantage of detecting tunneling current is that a vacuum is not required for accurate measurement. Air molecules do not affect the tunneling electrons because the air molecules are large compared to the distance between sensing needle 10 and node 12 (i.e. the distance the electron must tunnel).

Alternatively, field emmission current may be detected. However, a vacuum is required when detecting field emission current. In this case, the field of either sensing needle 10 or node 12, whichever is more negative, will take electrons from the electric field of the other and produce a field emission current in sensing needle 10.

Regardless of whether current 30 is produced by tunneling or field emission current, current 30 is a function of the potential difference between node 12 and sensing needle 10, and the distance between node 12 and sensing needle 10. Current 30 can be determined from the following node voltage equation:

$$V_s - IR - V_n = 0$$

Where,
  Vs is the voltage level of supply voltage 20;
  Vn is the voltage level on node 12;
  R is the tunneling resistance which increases as the distance between sensing needle 10 and node 12 increases and the resistance of sensing needle 10; and
  I is current 30.

Rearranging the terms:

$$I = (V_s - V_n)/R$$

Accordingly, current 30 will be affected if either supply voltage 20, the voltage level on node 12, or the distance between sensing needle 10 and node 12 changes.

In the present invention (shown in FIG. 1), the distance between sensing needle 10 and node 12 is fixed and the voltage is measured. Current 30 has an initial value corresponding to an initial potential difference between sensing needle 10 and node 12. Assuming the voltage on sensing needle 10 is more positive than the voltage on node 12, the potential difference between sensing needle 10 and node 12 decreases as the voltage on node 12 increases. Consequently, current 30 also decreases. The decrease in current is detected by current detector 26 and feedback signal 28 is generated to increase supply voltage 20 until current 30 returns to its initial value. When current 30 has returned to its initial value, the increase in supply voltage 20, and therefore the increase in voltage on sensing needle 10, equals the increase in the voltage on node 12.

As the voltage on node 12 decreases, the potential difference between sensing needle 10 and node 12 increases, as does current 30. The increase in current is detected by current detector 26 and feedback signal 28 is generated to decrease supply voltage 20 until current 30 returns to its initial value. When current 30 has returned to its initial value, the decrease in supply voltage 20, and therefore the decrease in voltage on sensing needle 10, equals the decrese in the voltage on node 12. Accordingly, the voltage on node 12 is determined by recording supply voltage 20.

It will be obvious to those skilled in the art that the voltage on sensing needle 10 may alternatively be set less positive than the voltage on node 12. In this case, current 30 will increase with an increase in voltage level on node 12. Consequently, supply voltage 20 must be increased to return current 30 to its initial value. When the voltage level on node 12 decreases, the current 30 decreases and supply voltage 20 must be decreased to return current 30 to its initial value. As was the case above, the increase or decrease in supply voltage 20 will equal the increase or decrease in the voltage level of node 12.

Figure 3:
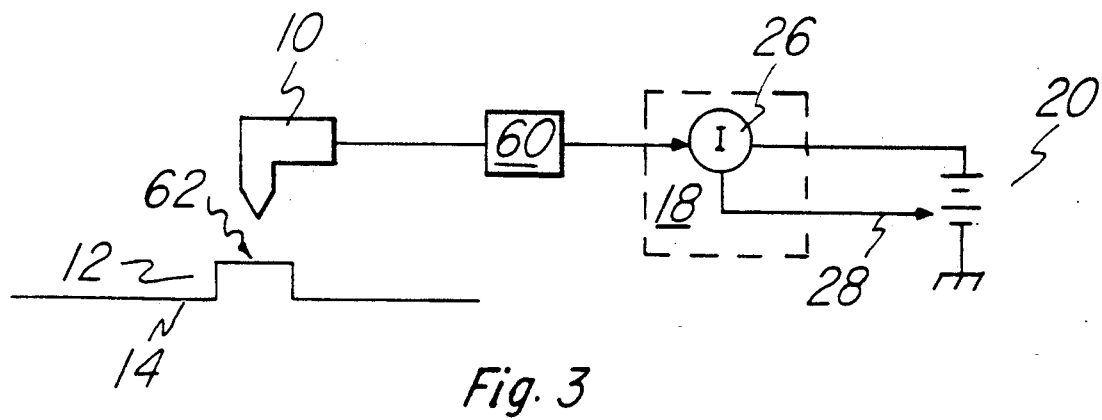
FIG. 3 is a schematic diagram of an apparatus for measuring node voltage including a sample and hold circuit, according to the invention.

If desired, a sample and hold circuit 60 may be inserted between sensing needle 10 and voltage control circuit 18 to increase the bandwidth of the system. Referring to FIG. 3, photon beam 62 is focused on to node 12. Alternatively, an ion or electron beam may be used. If the distance between sensing needle 10 and node 12 was too large to have much current, a current will be produced by photon beam 62 which in a sampling mode will allow the system to respond with the speed characteristics of photon beam 62. The bandwidth of the system can be very large since very short pulses of light (on the order of a picosecond) are possible.

Sample and hold circuit 60 can operate either in phase with the signal on node 12 or phase-shifted to monitor the entire waveform. In either case, current detector 26 and feedback signal 28 operate in the same manner as before except that sample and hold circuit 60 is inserted between current detector 26 and sensing needle 10. In other words, current detector 26 and feedback signal 28 respond to the sampled signal rather than the voltage level of node 12.

Although the invention has been described in detail with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations to the sensitivity of the measurements described herein. It is contemplated that all such changes and additional embodiments are within the spirit and true scope of the invention as claimed below.

I claim:

1. An apparatus for measuring node voltage on an integrated circuit comprising:
   (a) a conductive needle capable of collecting a current from said node;
   (b) a positioner for positioning said conductive needle a predetermined distance above said node; and
   (c) a voltage supply circuit coupled to said conductive needle for supplying a voltage to said conductive needle responsive to said current.

2. The apparatus of claim 1, wherein said voltage supply circuit comprises:
   (a) a current detector for detecting the current in said conductive needle;
   (b) a voltage source for supplying voltage to said conductive needle; and
   (c) a feedback signal line for adjusting said voltage source responsive to said current detected by said current detector.

3. The apparatus of claim 1, wherein said conductive needle comprises tungsten.

4. The apparatus of claim 1, wherein said current comprises tunneling current.

5. The apparatus of claim 4, wherein said predetermined distance is fixed to allow said conductive needle to collect said tunneling current from said node.

6. The apparatus of claim 1, wherein said current comprises field emission current.

7. The apparatus of claim 6, wherein said predetermined distance is fixed to allow said conductive needle to collect said field emission current from said node.

8. The apparatus of claim 1, wherein said positioning circuit comprises:
   (a) a first sensing arm;
   (b) a metal layer located over said first sensing arm;
   (c) a second sensing arm above said first sensing arm for attracting a sensing current from said metal layer; and
   (d) a z-drive for adjusting the height of the first and second sensing arms.

9. The apparatus of claim 1, further comprising:
   (a) a sample and hold circuit connected between said conductive needle and said adjustable voltage source; and
   (b) a beam focused on said integrated circuit for assisting injection of said current into said conductive needle.

10. The apparatus of claim 9 wherein said beam comprises a photon beam.

11. The apparatus of claim 9 wherein said beam comprises an electron beam.

12. The apparatus of claim 9 wherein said beam comprises an ion beam.

13. An apparatus for measuring node voltage on an integrated circuit comprising:
   (a) a sensing needle;
   (b) a positioner for positioning said sensing needle a small distance above said integrated circuit such that said sensing needle can collect a current from said integrated circuit;
   (c) an adjustable voltage source coupled to said sensing needle for supplying voltage to said sensing needle;
   (d) a current detector connected between said sensing needle and said adjustable voltage source for detecting said current in said sensing needle; and
   (e) a feedback signal line connected between said current detector and said adjustable voltage source for adjusting said adjustable voltage source.

14. The apparatus of claim 13, wherein said sensing needle comprises tungsten.

15. The apparatus of claim 13, wherein said current comprises tunneling current.

16. The apparatus of claim 13, wherein said current comprises field emission current.

17. The apparatus of claim 13, further comprising:
   (a) a sample and hold circuit connected between said sensing needle and said adjustable voltage source; and
   (b) a photon beam focused on said integrated circuit for assisting injection of the current into said sensing needle.

18. A method for measuring node voltage on an integrated circuit comprising the steps of:
   (a) positioning a conductive needle a fixed distance above said node;
   (b) supplying a voltage to said conductive needle at a predetermined voltage level;
   (c) adjusting said voltage to produce a current between said conductive needle and said node at a predetermined current level; and
   (d) maintaining said current at said predetermined current level by adjusting said voltage supplied to said conductive needle.

19. The method of claim 18, further comprising the step of detecting said current in said conductive needle.

20. The method of claim 19, further comprising the step of generating a feedback signal to adjust the voltage supplied to said conductive needle, responsive to said detected current.

21. The method of claim 18, wherein said current comprises a first tunneling current.

22. The method of claim 18, wherein said current comprises field emission current.

23. The method of claim 18, wherein said positioning step comprises the steps of:
   (a) providing a first sensing arm having a metal layer on a top side of said first sensing arm;
   (b) providing a second sensing arm above said first sensing arm wherein said second sensing arm collects a second tunneling current from said metal layer;
   (c) detecting said second tunneling current; and
   (d) adjusting the height of said first and second sensing arms, responsive to said second tunneling current.

24. The method of claim 18, further comprising the steps of:
   (a) focusing a beam on said node; and
   (b) generating a sample and hold signal to sample said current in said conductive needle.

25. The method of claim 24, wherein said sample and hold circuit is in phase with said beam.

26. The method of claim 24, wherein said sample and hold circuit is out of phase with said beam.

27. The method of claim 24, wherein said beam comprises a photon beam.

28. The method of claim 24, wherein said beam comprises a electron beam.

29. The method of claim 24, wherein said beam comprises a ion beam.

30. A method for measuring node voltage on an integrated circuit comprising the steps of:
   (a) positioning a sensing needle a fixed distance above said node;
   (b) providing a supply voltage to said sensing needle to establish a current at an initial current level between said sensing needle and said node, wherein said initial current level corresponds to a first voltage level on said node;
   (c) monitoring said current to detect a change in said current, wherein said change corresponds to a second voltage level on said node; and
   (d) adjusting said supply voltage, responsive to said change in current, such that said current returns to said initial current level.

31. The method of claim 30, wherein said current comprises a tunneling current.

32. The method of claim 30, wherein said current comprises field emission current.

33. The method of claim 30, further comprising the steps of:
   (a) focusing a photon beam on said node; and
   (b) generating a sample and hold signal to sample the current in said sensing needle.

* * * * *